United States Patent [19]

Abernathy

[11] Patent Number: 5,166,624
[45] Date of Patent: Nov. 24, 1992

[54] METHOD FOR TESTING ASSEMBLY SUSCEPTIBILITY TO ELECTROSTATIC DISCHARGE EVENTS

[75] Inventor: Michael G. Abernathy, Spring, Tex.

[73] Assignee: Compaq Computer Corporation, Houston, Tex.

[21] Appl. No.: 704,427

[22] Filed: May 23, 1991

[51] Int. Cl.$^5$ ............................................. G01N 27/60
[52] U.S. Cl. ...................................... 324/452; 324/72; 340/659
[58] Field of Search .................. 324/452, 424, 158 D, 324/537, 72, 536; 361/225; 340/659

[56] References Cited

U.S. PATENT DOCUMENTS

| | | | |
|---|---|---|---|
| 3,760,262 | 9/1973 | Chovanec et al. | 324/452 |
| 4,157,496 | 6/1979 | St-Jean | 324/424 |
| 4,803,436 | 2/1989 | Kresge et al. | 324/549 |
| 4,841,286 | 6/1989 | Kummer | 324/537 |

FOREIGN PATENT DOCUMENTS 1337839  8/1987  U.S.S.R. ............................. 324/537

OTHER PUBLICATIONS

ESD Discharge Waveform Measurement, the First Step in Human ESD Simulation by A. Tasker, Copyrighted '85, IEEE; reprinted from the Proceedings of the IEEE Int'l. Symposium on EMc, Wakefield, Mass. Aug. 20-22, 1985; pp. 161-1 to KPS-142.

An ESD Circuit Model with Initial Spikes to Duplicate Discharges from Hands with Metal Objects by P. Richman Copyrighted Dec. 1985, EMC Technology; reprinted w/permission, w/minor changes, pp. 150-1 to KPS-1797A.

ESD Testing: The Interface Between Simulator and Equipment Under Test by P. Richman and A. Tasker, Copyrighted '85, Proceedings of the 6th EMC, Symposium, Zurich Dec. 1985: "EMC 1985", pp. 1-7.

Primary Examiner—Jack B. Harvey
Assistant Examiner—Maura Regan
Attorney, Agent, or Firm—Konneker & Bush

[57] ABSTRACT

Method for determining the susceptibility of a protective device protected electronic assembly to electrostatic discharge events. The protective component is subjected to an electrostatic discharge event and the amount of kinetic energy transferred to the protective component during the electrostatic discharge event is determined. The susceptibility of the assembly to electrostatic discharge events is then determined based upon the amount of kinetic energy transferred to the protective component during the electrostatic discharge event.

14 Claims, 2 Drawing Sheets

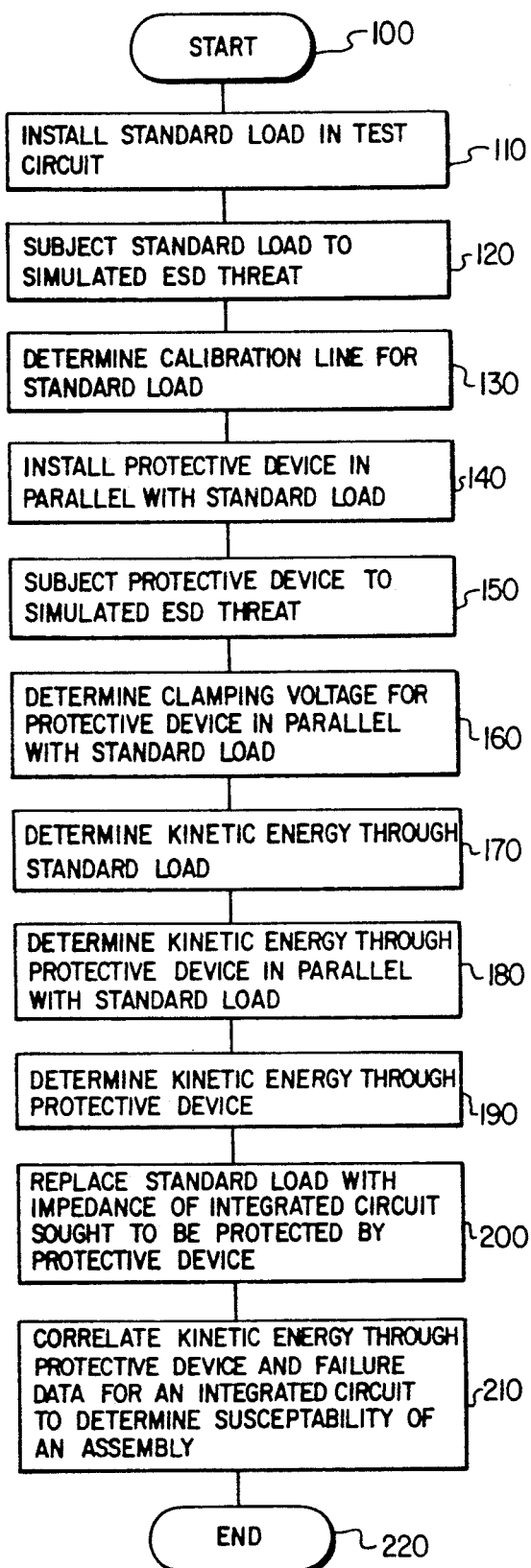
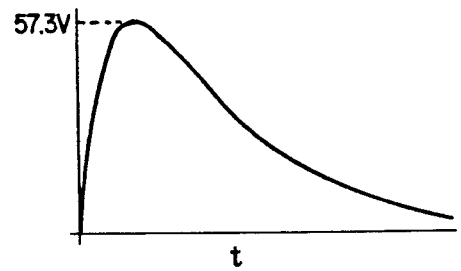
FIG. 1B
FIG. 2

METHOD FOR TESTING ASSEMBLY SUSCEPTIBILITY TO ELECTROSTATIC DISCHARGE EVENTS

BACKGROUND OF THE INVENTION

1. Field of the Invention

The invention relates to a method for determining the characteristics of a protective device to an electrostatic discharge event based upon kinetic energy levels transferred during an air discharge simulation of the electrostatic discharge event and, more particularly, to a method for testing the susceptibility of an assembly to an electrostatic discharge event based upon the characteristics of the protective device.

2. Description of Related Art

Electrostatic discharge events occur when there is a dielectric breakdown between two oppositely charged pockets of energy. For example, triboelectricity is the generation of charges when rubbing together and quickly separating two dissimilar materials. Triboelectricity can charge an insulated capacitor into a high voltage source. This charged capacitor may then be discharge to any conductor, thereby resulting in an electrostatic discharge event. While an assembly threatening, electrostatic discharge event may originate from any one of numerous sources, one very common source is a discharge from a metal object such as a key, tool, bracelet or ring held by or worn on the hands of a triboelectrically charged individual. Such discharges can readily generate a current wave having a high amplitude initial spike having a duration of about 1 to 4 nanoseconds and a peak current in the range of 10 to 30 A with a rise time of less than 1 nanosecond.

Other electrostatic discharge events, particularly those affected by certain parameters which are related to the arc formation and energy transfer which characterizes an electrostatic discharge event, can represent an even more serious threat to an assembly. These parameters, which include dielectric strength, humidity, atmospheric pressure, and speed at which the electric field gradient forms, can combine to give a threat which ranges from 200 picoseconds to 10 nanoseconds rise times, 1 amp to 100 amps peak current, microjoule to millijoule energy levels and up to 200 nanoseconds time duration. Thus, electrostatic discharge events, particularly those in the ranges herein identified, represent a significant threat to assemblies, particularly, those assemblies which include low voltage, discrete electronic devices such as microprocessors. Such assemblies would be severely damaged or destroyed if subjected to an electrostatic discharge event of such magnitude. In recent years, the need to protect such assemblies has become even more pressing with the increased use of CMOS and other low power semiconductor components. This recognition of the threat which electrostatic discharge events pose to the low power devices popular today has motivated increasing levels of interest in this phenomenon.

Considerable effort has been applied to the study of electrostatic discharge events, in particular to the study of the susceptibility of electronic components to various electrostatic discharge events. However, many factors have complicated the effective study of how to protect components from susceptibility to electrostatic discharge events. For example, the highly transient nature of electrostatic discharge events, the highly variable nature of the air through which an electrostatic event is discharged, and the differences between electrostatic discharge events caused by a simulator and by a triboelectrically charged person have seriously limited attempts to standardize electrostatic discharge event test techniques as well as attempts to establish the level of electrostatic discharge threat protection which should be provided for a given component.

While accurate modeling by electrostatic discharge event simulators of the threat produced by an electrostatic discharge event has improved in recent years (See, Richman, "An ESD Circuit Model with Initial Spikes to Duplicate Discharges from Hands with Metal Objects", *EMC Technology* (1985) and Richman and Tasker, "ESD Testing: The Interface Between Simulator and Equipment Under Test", *Proceedings of the 6th EMC Symposium*, Zurich, Switzerland, 1985), considerable difficulties in determining component susceptibility to electrostatic discharge events remain, particularly in view of the difficulties resultant from the fact that most electrostatic discharge events are air discharges. For example, Sperber and Minnich, "Test Procedure and Specification for Component Susceptibility to Electrostatic Discharges", *IEEE International EMC Symposium*, Seattle, Wash., 1988, recommends that the test procedures to determine component susceptibility to electrostatic discharges specify a fixed-gap method of discharge to the device under test (or "DUT") would provide consistency in test results. However, the method disclosed by Sperber and Minnich relied upon the discharge voltage for the ESD simulator measured by placing a high impedance probe across the ESD output to make evaluations.

SUMMARY OF THE INVENTION

In a first embodiment, the present invention is of a method for determining the susceptibility of an protective device protected electronic assembly to electrostatic discharge events. First, the protective component is subjected to an electrostatic discharge event. The amount of kinetic energy transferred to the protective component during the electrostatic discharge event is determined and the susceptibility of the assembly to electrostatic discharge events is determined based upon the amount of kinetic energy transferred to the protective component during the electrostatic discharge event.

In another embodiment, the present invention is of a method for determining the susceptibility of an assembly to electrostatic discharge events. A standard load is subject to a first electrostatic discharge event and the amount of kinetic energy transferred to the standard load during the first electrostatic discharge event is determined. A protective component is then connected in parallel with the standard load and the protective component is subjected to a second electrostatic discharge event. The amount of kinetic energy transferred to the protective component during the second electrostatic discharge event is determined and the susceptibility of the assembly to electrostatic discharge events is determined based upon the amount of kinetic energy transferred to said protective component during the first and second electrostatic discharge events, respectively.

BRIEF DESCRIPTION OF THE DRAWINGS

The invention may be better understood and its numerous objects, features and advantages become apparent to those skilled in the art by referencing the accompanying drawing in which:

FIG. 1b is a graphical illustration of an electrostatic discharge event which may be produced by the ESD simulator of the test circuit of FIG. 1a;

FIG. 2 is flow diagram of the method for determining the susceptibility of an assembly to electrostatic discharge events subject of the present invention;

DETAILED DESCRIPTION OF A PREFERRED EMBODIMENT

Figure 1A:
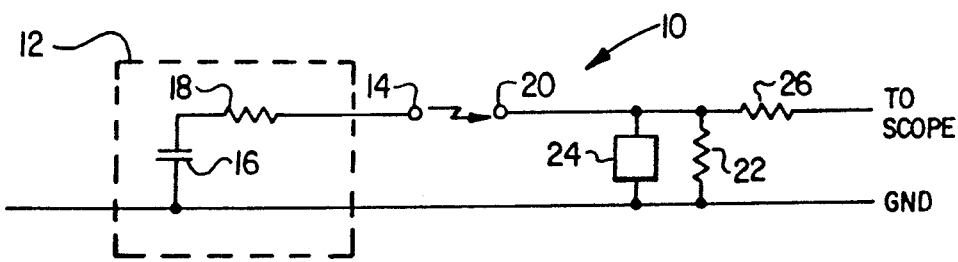
FIG. 1a is a schematic illustration of a test circuit which may be utilized to determine the susceptibility of an assembly to electrostatic discharge events in accordance with the method of the present invention.

Referring first to FIG. 1a, a test circuit 10 which may be utilized to determine the susceptibility of an electronic component such as an integrated circuit to electrostatic discharge events in accordance with teachings of the present invention may now be seen. The test circuit 10 includes an air discharged, electrostatic discharge event (or "ESD") simulator 12 which generates an electrostatic discharge to be propagated from a discharge tip 14 to a device under test (or "DUT"). The ESD simulator 12, which, for example, may be comprised of a charged storage capacitor, may be modeled as a simple RC circuit as illustrated in FIG. 1. In order to simulate the electrostatic discharge produced by a human body carrying a metal object, it is contemplated that the ESD simulator 12 should be comprised of a 150 pF capacitor 16 and a 150 Ohm resistor 18 connected in series with each other. Such a configuration would permit the ESD simulator 12 to be capable of producing an air discharge voltage of up to 20 kV having a rise time of under 1 nanosecond and a pulse duration between 25 and 35 nanosecond. An electrostatic discharge event such as the one herein described may be seen by reference to FIG. 1b.

Upon generation of an electrostatic discharge event by the ESD simulator 12, the electrostatic discharge event would propagate from the discharge tip 14 to a discharge target 20. Such a discharge is commonly known as an air discharge characterized by an electric arc between the discharge tip 14 and the discharge target 20. As to be more fully described below, in order to determine the susceptibility of a component to an electrostatic discharge event, a series of electrostatic discharge events must be propagated to the discharge target 20 when a standard load 22, for example, a 1 ohm resistor is connected between the discharge target 20 and ground. Afterwards, a second series of electrostatic discharge events must be propagated to the discharge target 20 with a protective device 24 connected in parallel with the standard load 22. As will also be more fully described below, certain data accumulated during the application of the first series of electrostatic discharge events to the standard load 22 and during the application of the second series of electrostatic discharge events to the standard load 22 and the protective device 24 connected in parallel shall be used to characterize a protective device to electrostatic discharge events. To measure the data needed to perform this analysis, a matched load 26 which, for example, may be a 49 ohm resistor, is connected between the standard load 22 and an oscilloscope (not shown), for example, a model 54111 oscilloscope manufactured by Hewlett Packard will also be included as part of the test circuit 10.

Referring next to FIG. 2, the method of determining the susceptibility of an electronic assembly to an electrostatic discharge event shall now be described in greater detail. The method of the present invention starts at step 100. At step 110, the standard load 22 is installed in the test circuit 10 and, at step 120, the standard load 22 is subjected to the first series of electrostatic discharge events. More specifically, a voltage level for the electrostatic discharge event is selected. Next, a series of electrostatic discharges having the selected voltage level are generated by the ESD simulator 12 and the voltage drop across the standard load 22 is measured for each of the generated electrostatic discharges. A next voltage level is then selected and a next series of electrostatic discharges having the next selected voltage are generated by the ESD simulator 12 and the voltage drop across the standard load is again measured. While numerous variations in the range and separation of the selected voltage levels and the number of electrostatic discharges generated at each of the selected voltage levels are possible without departing from the practice of the present invention, it is specifically contemplated that ten measurements of the voltage drop across the standard load 22 for generated electrostatic discharges having a potential energy in the range of 8 to 20 kV whereby the each of the selected voltages are separated from a successive selected voltage by 2 kV shall prove satisfactory for use.

Proceeding to step 130, a calibration line should now be calculated for the standard load 22 by plotting the average peak voltage measured across the standard load 22 at each potential voltage for the ESD simulator 12. Such a calibration line may be seen by reference to line "a" in FIG. 3a. Alternately, the calibration line for the standard load 22 may be calculated by plotting the maximum voltage measured across the standard load 22 at each potential voltage for the ESD simulator. This alternate calibration line may be seen by reference to line "a" in FIG. 3b.

Figure 3A:
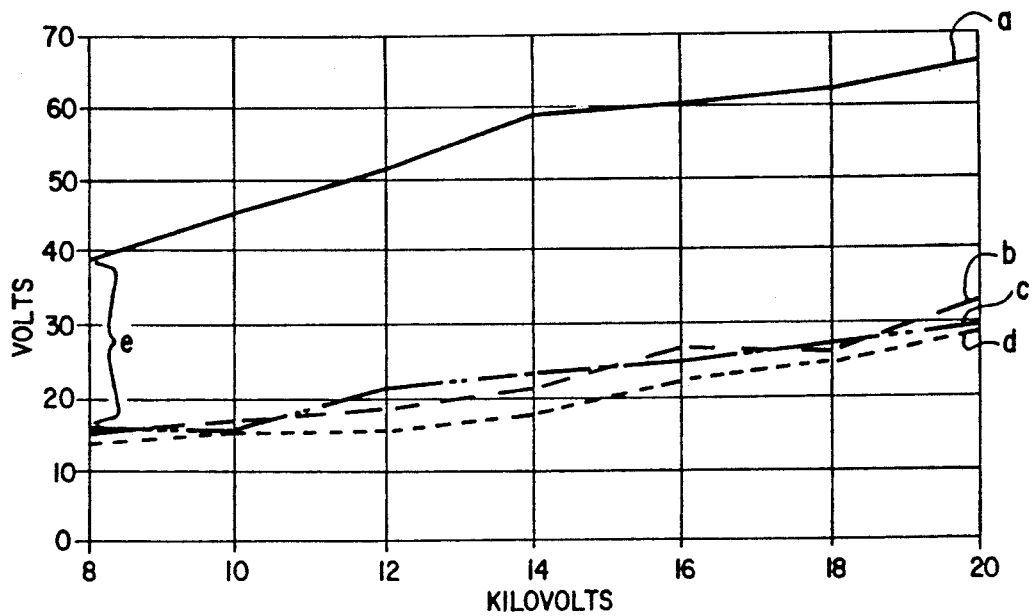
FIG. 3a is a graphical illustration of the average level of protection from electrostatic discharge events for a number of electronic components.
Figure 3B:
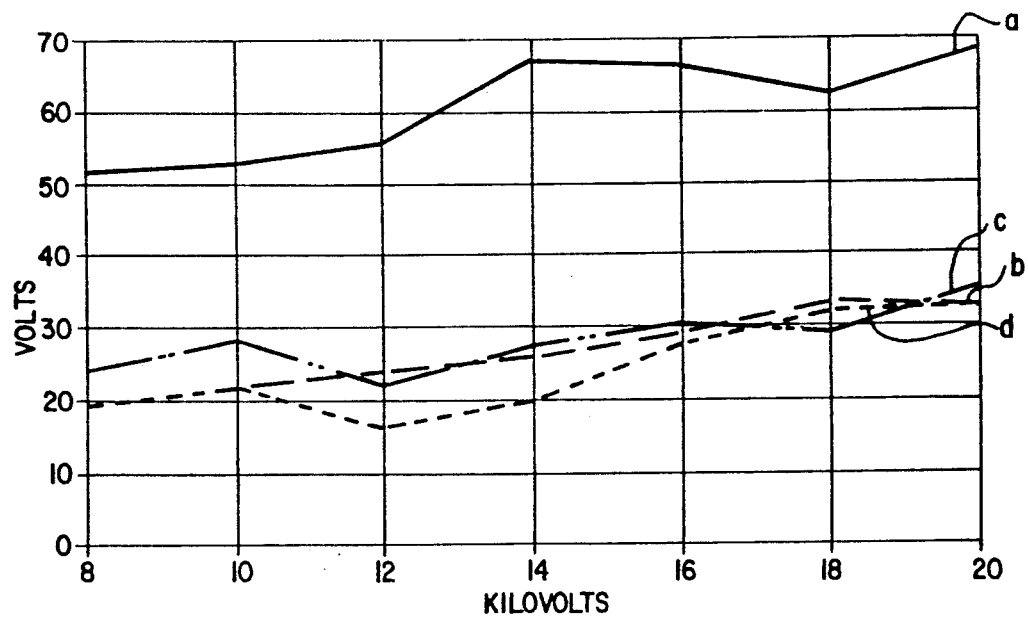
FIG. 3b is a graphical illustration of the peak level of protection from electrostatic discharge events for the electronic components.

At step 140, the protective device 24 is installed in parallel with the standard load 22. The protective device 24 may be selected from any one of several general categories, including metal-oxide varistor (or "MOV") type protective devices such as part number 1151098-19 marketed by AMP, multi-layer varistor (or "MLV") type protective devices such as part number VC1206140300 manufactured by AVX, and transient zener type protective device such as part number SMBG15 manufactured by GSI. Proceeding to step 150, the selected protective device 24 installed in the test circuit 10 is subject to a second series of electrostatic discharge events. Preferably, the number, magnitude and separation of electrostatic discharge events included in the second series should be the same as that included in the first series of electrostatic discharge events. Next, the potential voltage for the ESD simulator 12 versus the average voltage drop across the protective device 24 should be plotted. For example, in FIG. 3a, line "b" is a plot for the AMP protective device, line "c" is a plot for the AVX protective device and line "d" is a plot for the GSI protective device. So long as the impedance of the standard load 22 is constant over the frequency range, then current is related to voltage by a constant and each of the lines plotted in FIG. 3a represent a plot of potential energy versus kinetic energy. As before, the potential voltage across the ESD simulator 12 may be plotted versus the maximum voltage drop across the protective device 24 as illustrated in FIG. 3b. Proceeding to step 160, the clamping voltage for the protective device 24 in parallel with the standard load 22 may now be provided by determining the difference between the calibration line "a" and the appropriate plot of potential voltage versus voltage drop "b", "c", or "d". For example, in FIG. 3a, "e" is the clamping voltage for the AMP protective device.

Continuing to step 170, the kinetic energy through the standard load 22 should now be determined. The current flow through the standard load 22 may be represented as the difference of two exponentials as set forth in Equation (1), below:

$$I(t) = I_0(e^{-(alpha)t} - e^{-(beta)t})(mu)(t) \quad (1).$$

Potential energy through the ESD device 12 may be determined according to Equation (2), below:

$$W_p = 0.5CV^2 \quad (2).$$

Thus, since the assembly 10 is a current to voltage transducer, then current is related to voltage by a constant so long as the impedance of the standard load 22 is constant over the frequency range. Therefore, potential and kinetic energy are related by the constant C and the kinetic energy through the standard load 22 may then be determined from Equation (3), below:

$$W_k = Z \int_o^t I(t)^2 dt \quad (3)$$

Proceeding to step 180, the kinetic energy should then be calculated through for the protective device 24 in parallel with the standard load 22 in a similar manner and, at step 190, the kinetic energy through the protective device 24 may be determined by taking the difference thereof.

Having calculated the kinetic energy through the protective device 24 for an electrostatic discharge event, an analysis of the susceptibility of an assembly may now be performed. To do so, the standard load 22 should be replaced by the impedance of the integrated circuit for which protection is sought and the kinetic energy for the component should be recalculated using the substituted impedance. Next, the failure data for the component should be determined. Typically, the failure data, the voltage at which the component will fail, for nearly all electronic components are provided by the manufacturer of the component. Finally, at step 210, the kinetic energy through the protective device and the failure voltage for the component are correlated to determine the susceptibility of the assembly to the electrostatic discharge event which corresponds to the calculated kinetic energy. Specifically, if the kinetic energy is below the failure voltage, the assembly will not be susceptible to the corresponding electrostatic discharge event.

Thus, there has been described and illustrated herein, a method for determining the characteristics of a protective device to an electrostatic discharge event based upon kinetic energy levels transferred during an air discharge simulation of the electrostatic discharge event and utilizing the characteristics of the protective device to an electrostatic discharge to determine the susceptibility of an assembly electrically associated therewith to an electrostatic discharge event. However, those skilled in the art will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed is:

1. A method for determining the susceptibility of a protective component protected electronic assembly to electrostatic discharge events comprising the steps of:
    subjecting a standard load to an electrostatic discharge event;
    measuring the voltage drop across said standard load during said electrostatic discharge event;
    connecting a protective component in parallel with said standard load;
    subjecting said protective component to said electrostatic discharge event;
    measuring the voltage drop across said protective component in parallel with said standard load during said electrostatic discharge event;
    determining the amount of kinetic energy transferred to said protective component during said electrostatic discharge event; and
    determining the susceptibility of said assembly to said electrostatic discharge event based upon the amount of kinetic energy transferred to said protective component during said electrostatic discharge event and failure data for said protective component.

2. A method for determining the susceptibility of a protective component protected electronic assembly to electrostatic discharge events according to claim 1 wherein the step of subjecting a standard load to an electrostatic discharge event further comprises the steps of:
    selecting a series of voltage levels for said electrostatic discharge event; and
    generating multiple electrostatic discharges at each of said series of voltage levels.

3. A method for determining the susceptibility of a protective component protected electronic assembly to electrostatic discharge events according to claim 2 wherein the range of said selected series of voltage levels is between 8 and 20 kV and wherein successive ones of said series of voltage levels are separated by approximately 2 kV.

4. A method for determining the susceptibility of a protective component protected electronic assembly to electrostatic discharge events according to claim 2 wherein the step of generating multiple electrostatic discharges at each of said series of voltage levels further comprises the step of generating ten electrostatic discharges at each of said series of voltage levels.

5. A method for determining the susceptibility of a protective component protected electronic assembly to electrostatic discharge events according to claim 2 wherein the step of measuring the voltage drop across said standard load during said electrostatic discharge event further comprises the step of measuring the average peak voltage drop across said standard load at each of said series of voltage levels.

6. A method for determining the susceptibility of a protective component protected electronic assembly to electrostatic discharge events according to claim 2 wherein the step of measuring the voltage drop across said standard load during said electrostatic discharge event further comprises the step of measuring the maximum voltage across said standard load at each of said series of voltage levels.

7. A method for determining the susceptibility of a protective component protected electronic assembly to electrostatic discharge events according to claim 1 wherein the step of determining the amount of kinetic energy transferred to said protective component during said electrostatic discharge event further comprises the steps of:
   determining, from said measurement of the voltage drop across said standard load during said electrostatic discharge event, the amount of kinetic energy transferred to said standard load during said electrostatic discharge event;
   determining, from said measurement of the voltage drop across said protective component in parallel with said standard load during said electrostatic discharge event, the amount of kinetic energy transferred to said protective component in parallel with said standard load during said electrostatic discharge event; and
   determining, from said determined amount of kinetic energy transferred to said standard load during said electrostatic discharge event and said determined amount of kinetic energy transferred to said protective component in parallel with said standard load during said electrostatic discharge event, the amount of kinetic energy transferred to said protective component during said electrostatic discharge event.

8. A method for determining the susceptibility of an assembly to electrostatic discharge events comprising the steps of:
   subjecting a standard load to a first electrostatic discharge event;
   measuring the voltage drop across said standard load during said first electrostatic discharge event;
   connecting a protective component in parallel with said standard load;
   subjecting said protective component to a second electrostatic discharge event, said first and second electrostatic discharge events having approximately equal magnitudes;
   measuring the voltage drop across said protective component in parallel with said standard load during said second electrostatic discharge event;
   determining the amount of kinetic energy transferred to said protective component during said second electrostatic discharge event; and
   determining the susceptibility of said assembly to electrostatic discharge events based upon the amount of kinetic energy transferred to said protective component during said second electrostatic discharge event and failure data for said protective component.

9. A method for determining the susceptibility of an assembly to electrostatic discharge events according to claim 8 wherein the step of subjecting a standard load to a first electrostatic discharge event further comprises the steps of:
   selecting a series of voltage levels for said first electrostatic discharge event; and
   generating multiple electrostatic discharges at each of said series of voltage levels.

10. A method for determining the susceptibility of an assembly to electrostatic discharge events according to claim 9 wherein the range of said selected series of voltage levels is between 8 and 20 kV and wherein successive ones of said series of voltage levels are separated by approximately 2 kV.

11. A method for determining the susceptibility of an assembly to electrostatic discharge events according to claim 9 wherein the step of generating multiple electrostatic discharges at each of said series of voltage levels further comprises the step of generating ten electrostatic discharges at each of said series of voltage levels.

12. A method for determining the susceptibility of an assembly to electrostatic discharge events according to claim 9 wherein the step of measuring the voltage drop across said standard load during said first electrostatic discharge event further comprises the step of measuring the average peak voltage drop across said standard load at each of said series of voltage levels.

13. A method for determining the susceptibility of an assembly to electrostatic discharge events according to claim 9 wherein the step of measuring the voltage drop across said standard load during said first electrostatic discharge event further comprises the step of measuring the maximum voltage across said standard load at each of said series of voltage levels.

14. A method for determining the susceptibility of an assembly to electrostatic discharge events according to claim 8 wherein the step of determining the amount of kinetic energy transferred to said protective component during said second electrostatic discharge event further comprises the steps of:
   determining, from said measurement of the voltage drop across said standard load during said first electrostatic discharge event, the amount of kinetic energy transferred to said standard load during said first electrostatic discharge event;
   determining, from said measurement of the voltage drop across said protective component in parallel with said standard load during said second electrostatic discharge event, the amount of kinetic energy transferred to said protective component in parallel with said standard load during said second electrostatic discharge event; and
   determining, from said determined amount of kinetic energy transferred to said standard load during said first electrostatic discharge event and said determined amount of kinetic energy transferred to said protective component in parallel with said standard load during said second electrostatic discharge event, the amount of kinetic energy transferred to said protective component during said second electrostatic discharge event.

* * * * *